United States Patent
Maveety et al.

[11] Patent Number: 5,948,204
[45] Date of Patent: Sep. 7, 1999

[54] WAFER CARRIER RING METHOD AND APPARATUS FOR CHEMICAL-MECHANICAL PLANARIZATION

[75] Inventors: James G. Maveety, San Jose, Calif.; George T. Waller, Rio Rancho; Wayne Gaynor, Albuquerque, both of N.Mex.

[73] Assignee: Intel Corporation, Santa Clara, Calif.

[21] Appl. No.: 08/774,379

[22] Filed: Dec. 30, 1996

[51] Int. Cl.[6] .............................. C23F 1/02; B24B 49/00; B24B 1/00; B24B 7/00
[52] U.S. Cl. ................................ 156/345; 451/1; 451/28; 451/64; 451/177; 216/83; 216/89; 438/689; 438/690; 438/691; 438/692
[58] Field of Search .................................. 451/1, 28, 64, 451/177; 216/83, 89; 156/345; 438/689, 690, 691, 692

[56] References Cited

U.S. PATENT DOCUMENTS

| | | | |
|---|---|---|---|
| 5,624,299 | 4/1997 | Shendon | 451/28 |
| 5,635,083 | 6/1997 | Breivogel et al. | 216/88 |

*Primary Examiner*—James C. Housel
*Assistant Examiner*—V. Ryan
*Attorney, Agent, or Firm*—Blakely, Sokoloff, Taylor & Zafman

[57] ABSTRACT

The present invention discloses an improvement on a wafer carrier ring for use in a chemical-mechanical polishing apparatus for uniformly polishing semiconductor wafers. The apparatus comprises of a ring assembly, a stainless steel backing plate and a rubber bladder for holding the ring assembly and the backing plate. The ring assembly comprises of two rings. The first ring is made of a soft material such as Delrin or PBT for holding the stainless steel backing plate which is attached to the wafer. A top portion of the first ring is cutoff to leave an annular notch. The second ring is made of a hard material such as stainless steel and is fitted into the annular notch of the first ring. Both rings are attached to the rubber bladder through two sets of screws which are evenly spaced through a circular path concentric to the circumference of the first ring. The stainless steel material of the second ring improves the sealing to the rubber bladder and reduces the bending of the first ring during the polishing process. The results include reduced leakage from the sealing and reducing particle counts.

14 Claims, 3 Drawing Sheets

WAFER CARRIER RING METHOD AND APPARATUS FOR CHEMICAL-MECHANICAL PLANARIZATION

BACKGROUND OF THE INVENTION

1. Field of the Invention

This invention relates to the field of semiconductor manufacturing and, more specifically, to an improved method and apparatus for a wafer carrier for chemical-mechanical planarization (CMP) usage.

2. Description of Related Art

Semiconductor devices are typically made up of several layers to improve density and reduce interconnection complexity. On each layer, devices such as Metal Oxide Semiconductor (MOS) transistors are formed on a silicon substrate. Metalized contacts and vias are formed by depositing metal materials such as aluminum at contact points. Layers stacked one upon another are interconnected through an elaborate interconnection scheme.

Semiconductor manufacturing processes typically consist of several steps. One of the most important step is the planarization of the layers of the interconnection structure. Nonplanar surfaces create poor optical resolution of subsequent photolithographic processing steps, which in turn, prohibits the printing of high density lines.

To ensure planar topography, various planarization techniques have been developed. One approach, known as chemical-mechanical planarization (CMP), employs polishing to remove excess materials formed on the surface of the semiconductor wafers. In a typical chemical-mechanical polishing method, as shown in FIG. 1a and FIG. 1b, a silicon substrate or wafer 100 is placed facing downward on an orbital motion table 110 covered with a flat polishing pad 120 which is coated with an active chemical mixtures commonly referred to as "slurry" 125. The wafer 100 is mounted upward to wafer pad 135 which is coupled to a backing plate 130. The backing plate 130 and the wafer 100 are held by a wafer carrier ring 140 to prevent them from slipping laterally. Wafer carrier ring 140 is annular and is usually made of polymer such as PBT or Delrin. A rubber bladder 150 holds wafer carrier ring 140 and stainless steel backing plate 130. Wafer carrier ring 140 is fastened to wafer carrier plate 260 by a set of screws $160_f$ through $160_P$ ("P" being a positive whole number). The rubber bladder 150 is sandwiched in between wafer carrier ring 140 and wafer carrier plate 260 providing the sealing. The downward force F acting upon the backing plate 130 and the rotational movement of the polishing pad 120 together with the slurry 125 facilitate the abrasive polishing and planar removal of the surface of the wafer 100.

One major problem with the conventional CMP technique is the presence of defects that impact die yield and product reliability. If, for example, the pressure needed to ensure a quality polish process is too high, the wafer carrier ring could undergo extensive bending. With the extensive bending, the potential for defect generation is exacerbated since the over-stressed portion of the wafer carrier ring will be out of plane with the wafer, affecting slurry flow and causing wafer CMP polish non-uniformity. Another problem associated with the conventional CMP technique is that the sealing of the rubber bladder may be adversely affected during operation, resulting in leakage. To check for leakage, regular preventive and maintenance (PM) checks are regularly performed. PM times reduce equipment availability.

Therefore, it is desirable to have an improvement on the chemical-mechanical polish head structure to reduce the bending and the leakage of the sealing.

SUMMARY OF THE INVENTION

A present invention relates to a ring assembly attached to a rubber bladder and configured to secure a wafer during a polishing process. The ring assembly comprises a plurality of rings. The first ring is made of a soft material, and holds a backing plate which is attached to the wafer during the polishing process. The second ring is made of a hard material, and is attached to the first ring and a wafer carrier plate for reducing leakage from the rubber bladder and for reducing bending of the first ring during the polishing process.

BRIEF DESCRIPTION OF THE DRAWINGS

The features and advantages of the present invention will become apparent from the following detailed description of the present invention in which.

DESCRIPTION OF THE PRESENT INVENTION

In the following description, for purposes of explanation, numerous details are set forth in order to provide a thorough understanding of the present invention. However, it will be apparent to one skilled in the art that these specific details are not required in order to practice the present invention. In other instances, well-known machines and chemical-mechanical process steps are not described in particular detail in order not to obscure the present invention unnecessarily.

In general, the present invention discloses an improvement on the chemical-mechanical planarization ("CMP") technique. The wafer carrier ring is partially cut-off to reduce the thickness from the top. A stainless steel ring which acts as a seal ring is fitted into the cut-off portion of the wafer carrier ring. This stainless steel seal ring provides an air-tight seal for the wafer carrier ring and wafer carrier plate by minimizing ring deflection during the polishing process.

Figure 1A:
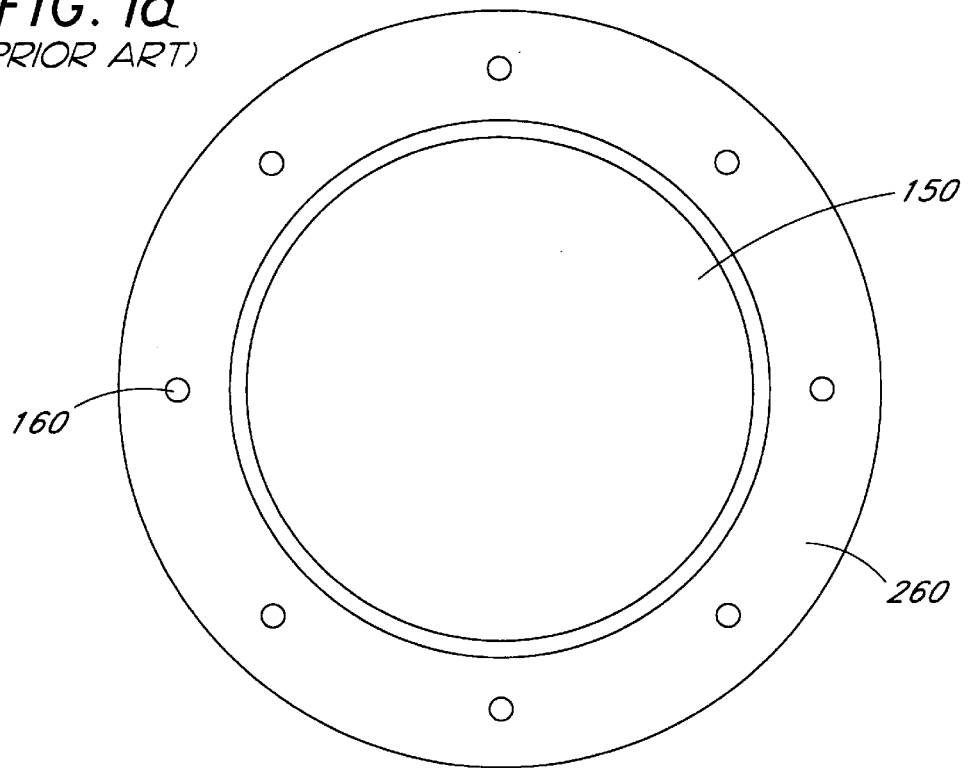
FIG. 1 is an illustration of the prior art.
Figure 1B:
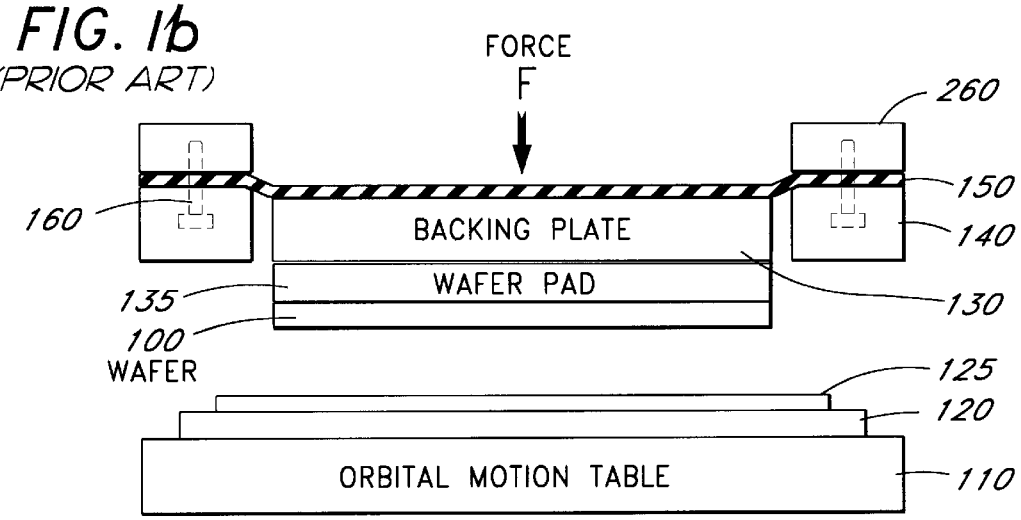
Figure 2:
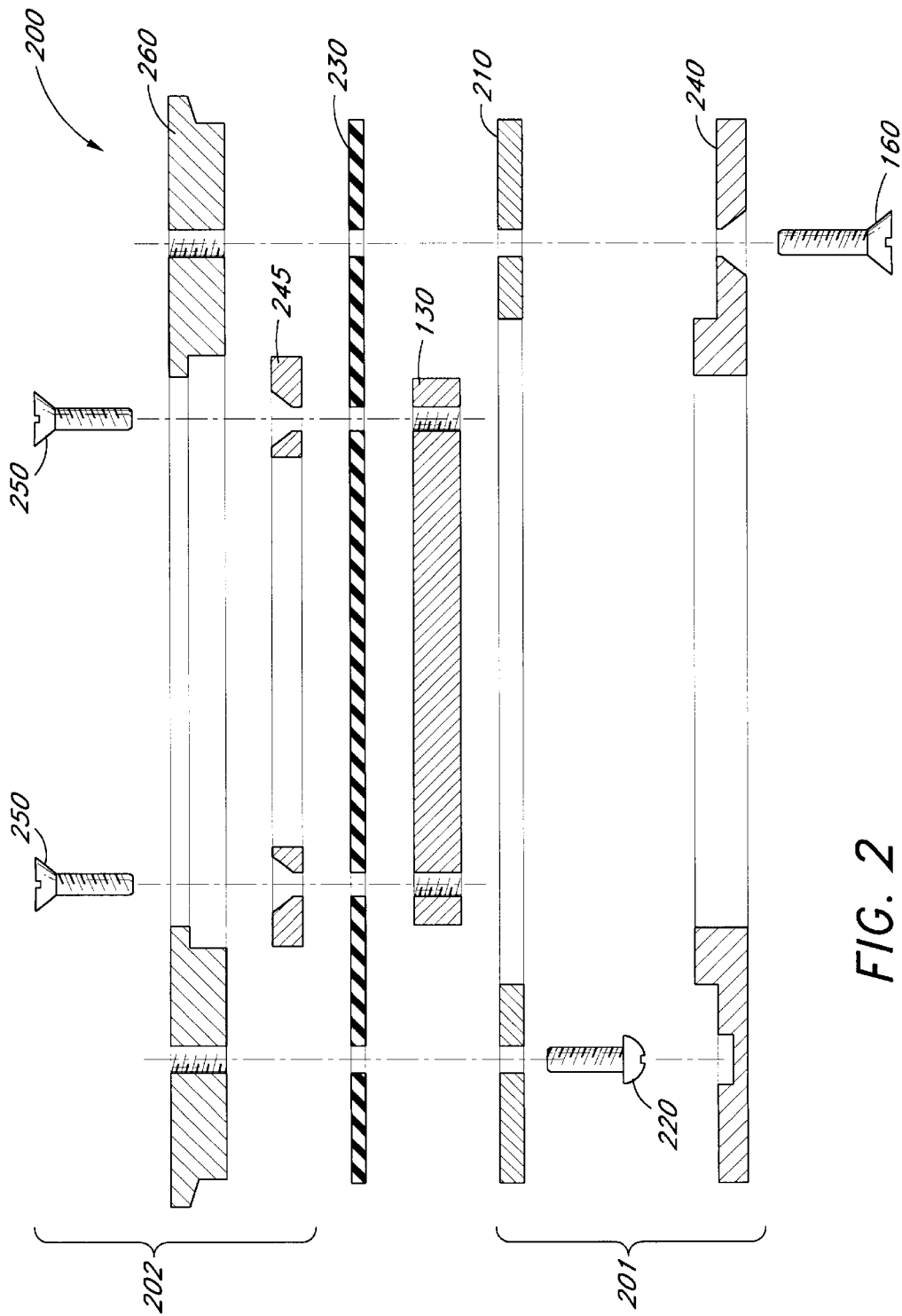
FIG. 2 is a diagram illustration of one embodiment of a system that operates in accordance with the teachings of the present invention.
Figure 4:
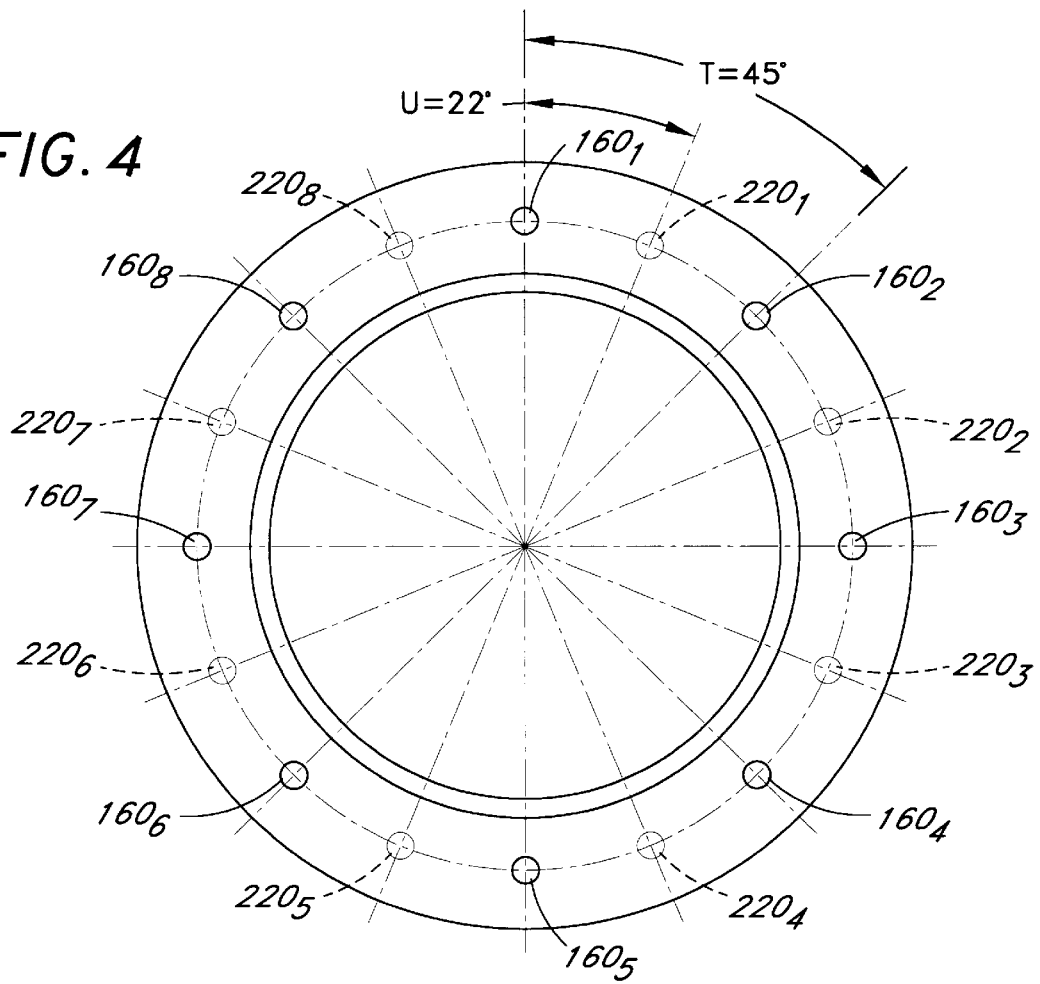
FIG. 4 is a top view illustration of one embodiment of the present invention.

Referring to FIG. 2, a cross-sectional side view of one embodiment of a tool assembly used for CMP is shown. The tool assembly 200 includes frame structure 202, ring assembly 201, backing plate 130, and rubber bladder 230. Frame structure 202 includes wafer carrier plate 260, retaining ring 245, and backing plate screw 250. Ring assembly 201 includes seal ring 210, wafer carrier ring 240, and seal ring screw 220. Wafer carrier plate 260, rubber bladder 230, seal ring 210 and wafer carrier ring 240 are fastened by a set of eight wafer carrier screws $160_1$ through $160_8$ as shown in FIG. 4. In addition, stainless steel seal ring 210 is fastened to wafer carrier plate 260 and rubber bladder 230 through a set of eight seal ring screws $220_1$ through $220_8$ as shown in FIG. 4.

The wafer carrier ring 240 is the annular ring that holds the stainless steel backing plate 130. Backing plate 130 is attached to the retaining ring 245 by backing plate screw 250. Rubber bladder 230 is positioned between wafer carrier plate 260 and the ring assembly, consisting of seal ring 210 and wafer carrier ring 240, to provide the sealing.

An upper portion of wafer carrier ring 240 is removed by cutting off from the outer circumference to create an annular notch. Seal plate 210 is positioned on wafer carrier ring 240 in place of the removed portion. Seal plate 210 therefore is also an annular ring fitted on wafer carrier ring 240. Seal plate 210 is preferably made of a hard material having a Knoop hardness value ranging from approximately 2000–7000. The hard material also has suitable chemical reactions during the polishing process. One such material is stainless steel. Wafer carrier ring 240 is preferably made of a soft material having a Rockwell R or Rockwell M hardness value between the ranges of approximately 90–150. Some examples of these soft materials are Polybutylene terephthalate (PBT), Delrin (acetyl plastic), Polyester (PET), and Poly ether ether ketone (PEEK). The soft material also has suitable chemical reactions during the polishing process. It should be appreciated that alternative materials having desirable properties, such as those described above, may be substituted without departing from the scope of the present invention.

Figure 3:
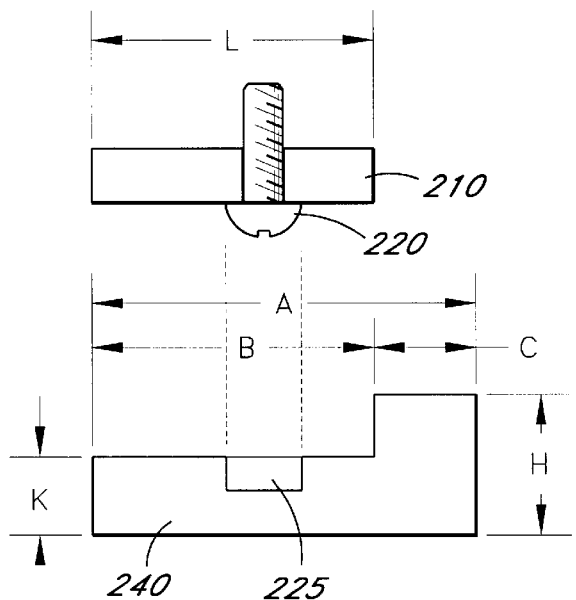
FIG. 3 is a cross-sectional side view illustration of one embodiment of the present invention.

An important feature of the present invention is the attachment of the stainless steel seal ring 210 to the wafer carrier ring 240 to reduce leakage and bending. FIG. 3 provides a cross-sectional side view with specific dimensions for one embodiment of the present invention. Referring to FIG. 3, the length A of the annulus of the wafer carrier ring 240 is approximately 2.05" with tolerances ±0.005". The length B of the cutoff portion or the annular notch from the outer circumference is 1.545" to 1.555" leaving the inner annular distance C of about 0.5". The inner thickness H of the wafer carrier ring 240 is approximately 0.370" with tolerances ±0.005". The outer thickness K of the wafer carrier ring 240 is approximately 0.185" with tolerances +0.005" and −0.000". The drill clearance 225 is located approximately 1.000" with tolerance±0.005" from the outer circumference. Drill clearance 225 has a diameter of about 0.375" with depth sufficient to accommodate the head of seal ring screw 220. The addition of the stainless steel seal ring 210 improves the sealing and reduces bending of wafer carrier ring 240. It is contemplated that these specific dimensions are for illustrative purposes of this embodiment. Of course, other dimensions may be used.

Stainless steel seal ring 210 is fitted into the cut-off portion or the annular notch of wafer carrier ring 240. Stainless steel seal ring 210 has length L, from the outer circumference of the ring assembly, of approximately 1.550" with a thickness of approximately 0.185" to 0.180". A set of seal ring screws $220_1$ through $220_8$ are used to attach stainless steel seal ring 210 and rubber bladder 230 to wafer carrier plate 260.

FIG. 4 shows the location of the set of eight wear ring screws $160_1$ through $160_8$ and the set of eight seal ring screws $220_1$ through $220_8$ as viewed from the top. Wafer carrier ring screws $160_1$ through $160_8$ and seal ring screws $220_1$ through $220_8$ are alternately located on a circular path 400 and located evenly over the entire ring. In other words, wafer carrier ring screws $160_1$ through $160_8$ are interleaved with seal ring screws $220_1$ through $220_8$ at equal arc distances. The angular separation T, as measured from the center O of the ring, between two consecutive screws of the same type is 45 degrees. The angular separation U as measured from the center between two consecutive screws of different types is 22.5 degrees. The arrangement of the screws on the ring is to ensure the even distribution of the force during rotation and tightened sealing of the rubber bladder.

The improvement as described in the present invention includes the placement of a stainless steel seal ring 210 on the cutoff portion of the wafer carrier ring 240. This placement of the stainless steel seal ring 210 provides a number of advantages.

The first advantage is that the seal ring 210 reduces leakage by improving the sealing effect. The stainless steel sealing ring 210 provides better sealing to the rubber bladder 230 than the wafer carrier ring 240 alone because of the metal-to-metal mounting as opposed to the delrin-to-metal mounting. The seal ring screws $220_1$ through $220_8$ attach the stainless steel sealing ring 210 with to the rubber bladder 230 to the wafer carrier plate 260 providing a tighter attachment. With better sealing, set-up parameters such as force and rotation speed can be accurately programmed providing better control of the equipment.

The second advantage is that there are less checking and repairing steps thanks to reduced leakage. With the new seal ring and the rubber bladder being attached to the wafer carrier plate with seal ring screws $220_1$ through $220_8$, the wafer carrier ring screws $160_1$ through $160_8$ are not over-torqued because stainless steal seal ring 210 now holds the seal rather than the wafer carrier ring 240. The preventive and maintenance (PM) time is reduced and the system down time is reduced. Productivity is thus improved. In addition, once the seal is established, the wafer carrier ring can be removed without affecting the pressure and vacuum seal.

The third advantage is that there is no bending of the wafer carrier ring 240. Since wafer carrier ring 240 is made of soft material such as Delrin or PBT which has a small modulus of elasticity, it tends to bend down under the pressure of the force F during rotation. The bending causes the wafer carrier ring 240 to touch the surface of the polishing pad and the wafer carrier ring 240 may be ground away. This grinding of the Delrin or PBT material may generate extra particles and cause impurities added to the wafer. In the present invention, the addition of the stainless steel seal ring prevents bending because stainless steel has a large modulus of elasticity. Without bending, there are no excess particles deposited on the surface of the wafer resulting in a smoother surface.

The advantages of the present invention are confirmed through extensive test data using the improved apparatus as described above. The main measurement for the improvement is the particle count. The particle count results are generated by scanning the wafer before and after the manufacturing process and computing the difference in particles as $\Delta p = p_2 - p_1$ where $p_1$ and $P_2$ are particle counts before and after the polish process. A negative value of $\Delta p$ indicates that the polishing actually reduces the particle count.

Table 1 shows the results of the overall average particle count within one standard deviation (±σ). Referring to Table 1, the particle count is significantly reduced from an average of 3.84 to −589.8. In addition, both polish rate and polish rate range are unaffected. Consequently, the manufacturing process is essentially unchanged but particles are substantially reduced.

TABLE 1

|  | p1 (Avg ± σ) | p2 (Avg ± σ) |
| --- | --- | --- |
| Particles | 3.84 ± 125.98 | −589.8 ± 372.1 |
| Tungsten Polish Rate | 3029.5 ± 138.5 | 2952.2 ± 120.8 |
| Polish Rate Range | 855.7 ± 266.8 | 1038.1 ± 298.1 |

Table 2 shows the results as a summary of particle data according to particle size. The numbers shown are differences in particle counts before and after the manufacturing process. There are three sizes: 0.25 μm, 0.5 μm, and 1.0 μm. The results are shown for three different systems using the improved apparatus of the present invention. In all three cases, the particle counts using the improved apparatus of the present invention are much less than the original apparatus.

TABLE 2

|  | Particle Size | | |
| --- | --- | --- | --- |
| Ring set-up | 0.25 μm | 0.5 μm | 1.0 μm |
| Original | 13.41 ± 31.1 | 11.93 ± 32.7 | −0.59 ± 2.98 |
| Ring 1 | 10.11 ± 9.1 | 0.35 ± 2.17 | −2.24 ± 6.83 |
| Ring 2 | 11.93 ± 32.7 | −0.86 ± 2.84 | −1.35 ± 4.02 |
| Ring 3 | 10.24 ± 25.7 | −1.35 ± 3.97 | −0.58 ± 2.97 |

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method for sealing a wafer carrier plate to a backing plate during a polishing process, the method comprising:
   securing the backing plate to a rubber bladder; coupling a ring assembly to the carrier plate with the rubber bladder therebetween for sealing and securing the backing plate during the polishing process, the ring assembly including a first ring and a second ring, the first ring having an annular cutoff portion, the second ring being coupled to the first ring by fitting the second ring into the annular cutoff portion of the first ring; and
   holding the backing plate and the ring assembly together during the polishing process by said rubber bladder.

2. The method of claim 1 wherein the first ring is attached to the wafer carrier plate and the rubber bladder by a first set of screws spaced evenly on a circular path concentric with a circumference of the first ring.

3. The method of claim 2 wherein the second ring to the first ring further comprises attaching the second ring is attached to the wafer carrier plate and the rubber bladder by a second set of screws spaced evenly on a circular path concentric with a circumference of the first ring and interleaved with the first set of screws.

4. The method of claim 1 wherein the annular cutoff portion is created by cutting off a top portion of the first ring.

5. The method of claim 1 wherein the first ring is made of a first material and the second ring is made of a second material.

6. The method of claim 5 wherein the second material is stainless steel.

7. The method of claim 5 wherein the first material is selected from the group consisting of polybutylene terephthalate, acetyl plastic, polyester, and poly ether ether ketone.

8. A tool assembly for use in a polishing process for a wafer comprising:
   a backing plate for holding the wafer during the polishing process;
   a frame structure coupled to the backing plate, the frame structure provides a frame attachment to the backing plate;
   a ring assembly coupled to the frame structure for sealing and securing the backing plate during the polishing processing, the ring assembly comprising:
   a first ring having an annular cutoff portion, and
   a second ring coupled to the first ring by fitting the second ring into the annular cutoff portion of the first ring; and
   a rubber bladder coupled to the backing plate, the frame structure and the ring assembly, the rubber bladder holds the backing plate, the frame structure, and the ring assembly together during the polishing process.

9. The tool assembly of claim 15 wherein the frame structure further comprises:
   a wafer carrier plate;
   a retaining ring for providing a support to the wafer carrier; and
   a first plurality of screws to attach the retaining ring to the rubber bladder and the backing plate.

10. The tool assembly of claim 15 wherein
    the first ring is made of a first material and
    the second ring is made of a second material.

11. The tool assembly of claim 10 wherein the first material is selected from the group consisting of polybutylene terephthalate, acetyl plastic, polyester, and poly ether ether ketone.

12. The tool assembly of claim 10 wherein the second material is stainless steel.

13. The tool assembly of claim 10 wherein the first ring is attached to the frame structure and the rubber bladder by a second plurality of screws spaced evenly on a circular path concentric with a circumference of the first ring.

14. The tool assembly of claim 13 wherein the second ring is attached to the frame structure and the rubber bladder by a third plurality of screws spaced evenly on a circular path concentric with the circumference of the first ring and interleaved with the second plurality of screws.

* * * * *

UNITED STATES PATENT AND TRADEMARK OFFICE
CERTIFICATE OF CORRECTION

PATENT NO.     : 5,948,204
DATED          : September 7, 1999
INVENTOR(S)    : Maveety et al.

It is certified that error appears in the above-identified patent and that said Letters Patent is hereby corrected as shown below:

Column 5,
Line 40, delete "the second ring to the first ring further comprises attaching"

Column 6,
Lines 24 and 32, delete "claim 15" and insert -- claim 8 --.

Signed and Sealed this

Twenty-seventh Day of May, 2003

JAMES E. ROGAN
*Director of the United States Patent and Trademark Office*